(12) United States Patent
Nakamura et al.

(10) Patent No.: US 8,816,712 B2
(45) Date of Patent: Aug. 26, 2014

(54) INSPECTION DEVICE

(75) Inventors: Mitsuhiro Nakamura, Hitachinaka (JP); Hiroshi Toyama, Hachioji (JP); Yasuhiko Nara, Hitachinaka (JP); Katsuo Oki, Kasama (JP); Tomoharu Obuki, Hitachinaka (JP); Masahiro Sasajima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 708 days.

(21) Appl. No.: 13/058,158

(22) PCT Filed: Jul. 29, 2009

(86) PCT No.: PCT/JP2009/063835
§ 371 (c)(1),
(2), (4) Date: Feb. 8, 2011

(87) PCT Pub. No.: WO2010/016504
PCT Pub. Date: Feb. 11, 2010

(65) Prior Publication Data
US 2011/0140729 A1    Jun. 16, 2011

(30) Foreign Application Priority Data
Aug. 8, 2008  (JP) ................................. 2008-204984

(51) Int. Cl.
*G01R 31/00* (2006.01)
*H01J 37/20* (2006.01)
*G01R 31/307* (2006.01)
*H01J 37/28* (2006.01)
*G01R 31/28* (2006.01)

(52) U.S. Cl.
CPC ....... *G01R 31/307* (2013.01); *H01J 2237/2008* (2013.01); *H01J 37/20* (2013.01); *G01R 31/2853* (2013.01); *H01J 37/28* (2013.01); *H01J 2237/24564* (2013.01)
USPC ............ 324/756.01; 324/754.03; 324/756.06

(58) Field of Classification Search
USPC ....................... 324/754.01–765.01
See application file for complete search history.

(56) References Cited

U.S. PATENT DOCUMENTS 5,289,123 A * 2/1994 Bublitz et al. ................ 324/263
5,389,787 A   2/1995 Todokoro et al.
(Continued)

FOREIGN PATENT DOCUMENTS

JP   5-144399    6/1993
JP   09-326425   12/1997
(Continued)

OTHER PUBLICATIONS

Japanese Office Action, w/ partial English translation thereof, issued in Japanese Patent Application No. JP 2008-204984 dated Jan. 29, 2013.

*Primary Examiner* — Jermele M Hollington
*Assistant Examiner* — Dustin Dickinson
(74) *Attorney, Agent, or Firm* — McDermott Will & Emery LLP

(57) ABSTRACT

An object of the invention is to provide an inspection device which has a function of preventing electric discharge so that an absorbed current is detected more efficiently.
In the invention, absorbed current detectors are mounted in a vacuum specimen chamber and capacitance of a signal wire from each probe to corresponding one of the absorbed current detectors is reduced to the order of pF so that even an absorbed current signal with a high frequency of tens of kHz or higher can be detected. Moreover, signal selectors are operated by a signal selection controller so that signal lines of a semiconductor parameters analyzer are electrically connected to the probes brought into contact with a sample. Accordingly, electrical characteristics of the sample can be measured without limitation of signal paths connected to the probes to transmission of an absorbed current. In addition, a resistance for slow leakage of electric charge is provided in each probe stage or a sample stage.

9 Claims, 2 Drawing Sheets

(56) References Cited

U.S. PATENT DOCUMENTS

| | | | |
|---|---|---|---|
| 6,466,027 B1* | 10/2002 | Suzuki | 324/458 |
| 6,545,603 B1* | 4/2003 | Launay et al. | 340/540 |
| 7,098,455 B2* | 8/2006 | Shinada et al. | 250/310 |
| 7,297,945 B2* | 11/2007 | Hazaki et al. | 250/306 |
| 7,372,283 B2* | 5/2008 | Furukawa et al. | 324/754.22 |
| 2006/0267573 A1* | 11/2006 | Horii et al. | 324/97 |
| 2007/0145301 A1* | 6/2007 | Tomimatsu et al. | 250/492.21 |
| 2008/0135754 A1 | 6/2008 | Eto | |
| 2008/0203297 A1* | 8/2008 | Obuki et al. | 250/307 |
| 2009/0166557 A1* | 7/2009 | Makino et al. | 250/442.11 |

FOREIGN PATENT DOCUMENTS

| | | |
|---|---|---|
| JP | 11-219882 | 8/1999 |
| JP | 2000-180385 | 6/2000 |
| JP | 2002-343843 | 11/2002 |
| JP | 2005-347773 | 12/2005 |
| JP | 2006-234789 | 9/2006 |
| JP | 2007-189113 | 7/2007 |
| JP | 2008-166702 | 7/2008 |
| JP | 2009-141090 | 6/2009 |

* cited by examiner

INSPECTION DEVICE

RELATED APPLICATIONS

This application is the U.S. National Phase under 35 U.S.C. §371 of International Application No. PCT/JP2009/063835, filed on Jul. 29, 2009, which in turn claims the benefit of Japanese Application No. 2008-204984, filed on Aug. 8, 2008, the disclosures of which Applications are incorporated by reference herein.

TECHNICAL FIELD

The present invention relates to an inspection device for a semiconductor sample or the like and particularly relates to a technique for detecting an absorbed current of a semiconductor sample or the like and observing secondary electrons to thereby specify an electrical defect in a wire of the semiconductor sample or the like.

BACKGROUND ART

As for a semiconductor inspection device, there has been heretofore disclosed a method of bringing sharp-edged probes into contact with a sample under observation with a scanning electron microscope and measuring current-voltage characteristic between the probes by an electrical characteristic measuring circuit to obtain local electrical characteristic of a cell, as described in Patent Literature 1.

There has been further disclosed a method of bringing two probes into contact with wires or pads on opposite sides of a wiring system having a defect and irradiating and scanning charged particle beams on a surface of a semiconductor device to thereby absorb the charged particle beams to the wires, detect the charged particle beams (current) absorbed by the wires, amplify the detected current by an amplifier, convert the amplified current into an image signal and then display the image signal as an absorbed current image on a screen of a computer, as described in Patent Literature 2.

CITATION LIST

Patent Literature

[Patent Literature 1]: JP-A-09-326425
[Patent Literature 2]: JP-A-2002-343843

SUMMARY OF INVENTION

Technical Problem

Because the conventional inspection device for detecting an absorbed current as described in cited literature 2 gives no consideration to the point that a semiconductor parameters analyzer or the like as described in cited literature 1 is used for performing measurement of electrical characteristics such as resistance in a stage before or after an electrical defect of a sample is specified based on an absorbed current image, there is a problem that there is not provided any path connecting each probe to the outside of the device without interposition of any absorbed current detector.

Moreover, in the conventional device, the absorbed current detector is disposed on the outside of a vacuum specimen chamber. However, because the wire length from each probe to the absorbed current detector becomes large, there is a problem that stray capacitance contained in the wire makes it difficult to detect an absorbed current signal, for example, with a high frequency of the order of tens of kHz or higher. Although provision of an amplifier in a process chamber may be conceived as described in cited literature 2, there is a problem that heat storage in the amplifier is a barrier to accurate measurement.

Moreover, because the probe of the conventional inspection device may be electrically charged by electron beam irradiation, there is a possibility that electrical charging of the sample and the probe may cause electric discharge in the vicinity of the sample to damage the sample and the probe when the probe connected to the absorbed current detector is brought into contact with the sample.

On the other hand, a sample stage of the conventional inspection device is made of a metal having conductivity to an electrical earthing point in order to reduce electrical charging of the sample due to electron beam irradiation. If the sample stage made of such a metal has conductivity to the electrical earthing point of the device, there is a problem that the absorbed current cannot be detected because the absorbed current on the wire flows toward the electrical earthing point when the wire in the sample comes into contact with the sample stage.

Moreover, the image display function of the conventional sample inspection device has no function of indicating a current scanning point when the absorbed current image is displayed on a monitor in synchronization with scanning of the electron beam. For this reason, when a target portion to be observed under low-speed scanning is present in the uniform background of the scanning region, it is difficult to specify the point of scanning in the background so that there is a possibility that the current scanning point will be missed.

In consideration of the aforementioned problems, an object of the invention is to provide an inspection device which has a function of preventing electric discharge so that an absorbed current is detected more efficiently.

Solution to Problem

To achieve the foregoing object, there is provided an inspection device including: an electron beam source; an objective lens which focuses an electron beam emitted from the electron beam source on a sample; a sample stage on which the sample is placed; and probes which come into contact with the sample, wherein: the sample stage includes a conductive plate for placing the sample thereon, and a plate made of an insulating material; and the conductive plate is grounded through a resistance.

Moreover, there is provided an inspection device including: an electron beam source; an objective lens which focuses an electron beam emitted from the electron beam source on a sample; a sample stage on which the sample is placed; and probes which come into contact with the sample, wherein: the inspection device further includes a signal analyzer, and switches; the probes are connected to an earth side or the signal analyzer through the switches respectively; and the switches are turned to the earth side before the probes are brought into contact with the sample, and the switches are turned to the signal analyzer after the probes are brought into contact with the sample.

Moreover, there is provided an inspection device including: an electron beam source; an objective lens which focuses an electron beam emitted from the electron beam source on a sample; a sample stage on which the sample is placed; a specimen chamber in which the sample stage is disposed; an electron beam deflection means which scans the electron beam on the sample; probes which come into contact with the sample; and absorbed current detectors each of which can detect a current flowing in corresponding one of the probes, wherein: the inspection device further includes: a signal analyzer which observes the absorbed current image and measures electrical characteristics of the sample; and switches which select one from a signal path for connecting the probes to the signal analyzer through the absorbed current detectors and a signal path for connecting the probes to the signal analyzer. The absorbed current detectors are disposed in a metal casing in the specimen chamber, and the metal casing is in contact with an inner wall of the specimen chamber and filled with a gas.

Advantageous Effects of Invention

According to the invention, the following effects are obtained.

While an electrical defect in a wire in a semiconductor sample or the like can be specified by observation of an absorbed current image, electrical characteristics such as resistance of the electrical defect can be measured.

When the absorbed current detectors are disposed in the specimen chamber, an absorbed current signal with a higher frequency can be detected. Accordingly, while an absorbed current corresponding to a micro pattern in the sample can be detected, high-speed scanning of the electron beam can be supported. Moreover, the heat storage preventing mechanism of each absorbed current detector has an effect in improving observation efficiency of the absorbed current image.

There is an effect that the sample and the probes are prevented from being damaged by electrical charging of the sample and the probes when the probes are brought into contact with the sample.

The absorbed current image can be observed while electrical charging of the sample is reduced without leakage of the absorbed current to the sample having a structure with a wire revealed on a front or rear surface.

Operator's working efficiency can be improved without missing of the current scanning point of the incident electron beam in retrieval of a defect in the sample based on observation of the absorbed current image.

DESCRIPTION OF EMBODIMENTS

Embodiments of the invention will be described below with reference to the accompanying drawings.

Figure 1:
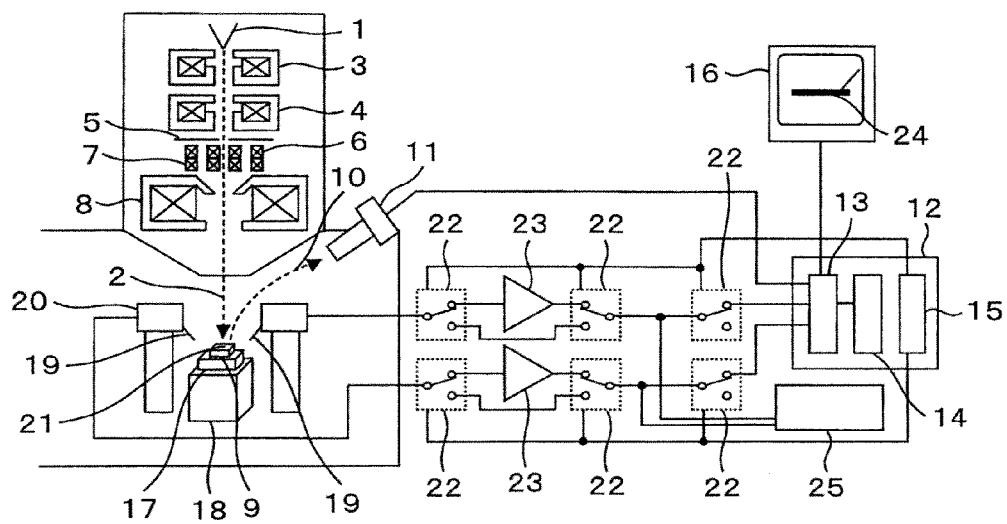
FIG. 1 is a diagram showing the configuration of a sample inspection device to which a first embodiment of the invention is applied.

FIG. 1 is a diagram showing the configuration of a sample inspection device to which a first embodiment of the invention is applied. An incident electron beam 2 irradiated from an electron beam source 1 is irradiated on a sample 9 via condenser lenses 3 and 4, an aperture 5, a scanning deflector system 6, an image shifting deflector system 7 and an objective lens 8. On this occasion, the incident electron beam 2 scans a front surface of the sample 9 based on the scanning deflector system 6, etc.

Secondary electrons 10 emitted from the sample 9 irradiated with the incident electron beam 2 are detected by a secondary electron detector 11.

The secondary electron detector 11 which is a detector capable of detecting secondary electrons emitted from the sample is controlled by an SEM controller 12. The SEM controller 12 has a video board 13, a memory 14, and a signal selection controller 15. A signal inputted from the secondary electron detector 11 is converted into a digital signal by the video board 13, so that an image is displayed on a monitor 16 in synchronization with scanning of the incident electron beam 2. Because the image is displayed on the monitor 16 in synchronization with the scanned incident electron beam 2, the secondary electrons 10 are displayed as a SEM image. This signal and the SEM image are recorded on the memory 14. Incidentally, the whole of the sample inspection device is controlled by the SEM controller 12.

The sample 9 is fixed to a sample holder 17. And a structure is provided that has means which the sample 9 can be moved in directions of three axes X, Y and Z by a sample stage 18 which is a sample table capable of placing the sample thereon. Probes 19 which can be brought into contact with the sample have a structure in which the probes 19 can be moved in directions of three axes X, Y and Z by probe stages 20 in the same manner as the sample stage 18.

The sample stage 18 and the probe stages 20 are moved/controlled in the directions of three axes X, Y and Z so that the probes 19 are brought into contact with the front surface of the sample 9.

A wiring pattern 21 is provided in the front surface of the sample 9, so that the probes 19 are brought into contact with opposite ends or pads of the wiring pattern 21. For observation of an absorbed current image, the incident electron beam 2 emitted from the electron beam source 1 is scanned on the front surface of the sample 9 inclusive of the wiring pattern 21 in this state. Among the irradiated incident electron beam 2, electrons entering the wiring pattern 21 are detected as an absorbed current by the probes 19. The absorbed current is inputted into absorbed current detectors 23 through signal selectors 22, so that the absorbed current is subjected to current-voltage conversion and amplification. This signal is displayed as an absorbed current image 24 on the monitor 16 in synchronization with scanning of the incident electron beam 2 in the same manner as the SEM image. This signal and the absorbed current image 24 are recorded on the memory 14.

For execution of measurement of electrical characteristic of the sample 9, the signal selectors 22 are operated by the signal selection controller 15 so that signal lines of a semiconductor parameters analyzer 25 are electrically connected to the probes 19 brought into contact with the sample 9. For example, a latching relay can be used as each of the signal selectors 22. By this function, a voltage or current from the semiconductor parameters analyzer 25 can be applied to the sample 9 without limitation of signal paths connected to the probes 19 to transmission of an absorbed current, so that desired electrical characteristics can be measured.

Figure 2:
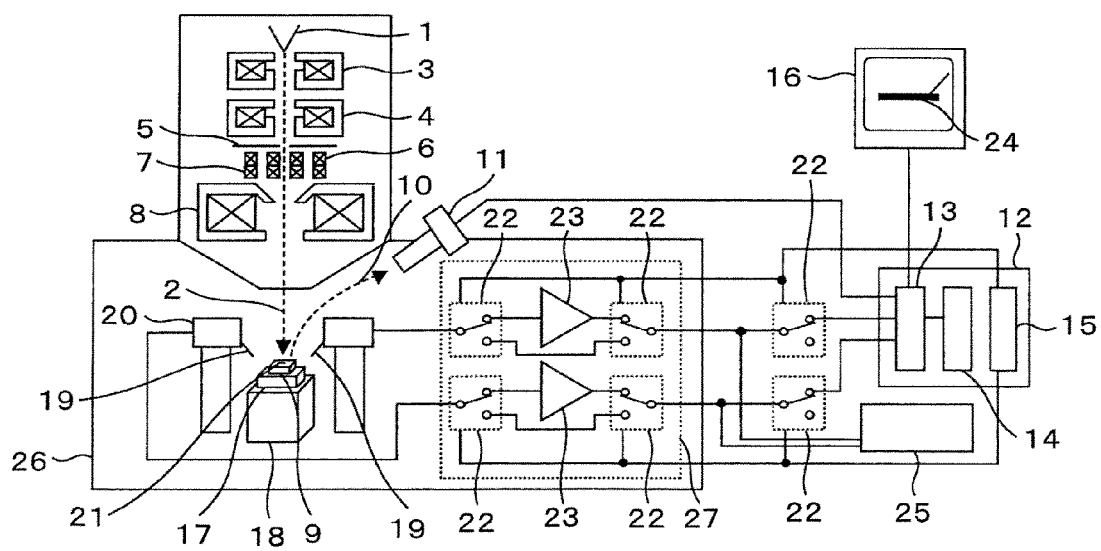
FIG. 2 is a diagram showing the configuration of a sample inspection device to which a second embodiment of the invention is applied.

FIG. 2 is a diagram showing the configuration of a sample inspection device to which a second embodiment of the invention is applied.

The basic configuration of the second embodiment is the same as that of the first embodiment. In the basic configuration of the second embodiment, there is provided a function of selecting signal paths connected to the probes 19 by using the signal selectors 22 and the signal selection controller 15 to thereby connect the probes 19 to the semiconductor parameters analyzer 25 without interposition of the absorbed current detectors 23.

The point of difference of the second embodiment from the first embodiment lies in that the absorbed current detectors 23 enclosed in a metal casing 27 are mounted in a vacuum specimen chamber 26. However, the signal selectors 22 provided in the first embodiment can be also disposed in the metal casing 27.

When the inside of the metal casing 27 is vacuum, heat generated in the absorbed current detectors 23 and the signal selectors 22 mounted in the inside of the metal casing 27 is hardly propagated to the outside of the metal casing 27 compared with propagation in the air, so that the operating temperature of the absorbed current detectors 23 and the signal selectors 22 increases to nearly 70° C.-90° C. For example, whenever the temperature of each absorbed current detector 23 increases by 10° C., the input bias current of the detector increases by about twice. Because an offset is generated in the output voltage of the detector in accordance with the increase in the input bias current, gradation of the absorbed current image is gradually shifted to the white or black side. It is necessary to adjust gradation of the image during observation.

It is therefore preferable that an O-ring or a metal packing or the like is used in a plate metal joint portion constituting the metal casing 27 to give sealing ability to the plate metal joint portion to thereby give the same pressure as the air pressure internally. As a result, heat generated in the absorbed current detectors 23 and the signal selectors 22 can be easily propagated to the outside through a gas inside the metal casing 27, so that temperature rise in the absorbed current detectors 23 and offset change in the output voltage of the detectors can be reduced. Moreover, the metal casing 27 has an effect in covering electro-magnetic noise incident on the absorbed current detectors 23.

When a co-axial cable is used as a signal line connected to each probe 19, capacitance of the signal wire from the probe 19 to the absorbed current detector 23 increases as the length of the wire increases because the co-axial cable has capacitance of about 67 pF/m to 100 pF/m. Because impedance to the high-frequency signal decreases as the capacitance of the wire increases, the high-frequency component of the absorbed current detected by the probe 19 is easily leaked to the earth potential side of the co-axial cable so that the input to the absorbed current detector 23 decreases. Accordingly, when the sample containing a micro pattern is subjected to observation of the absorbed current image, the scanning time of the incident electron beam 2 on the micro pattern is so short that the absorbed current detected at this portion by the probe is provided as a high-frequency signal. However, when the wire length from the probe 19 to the absorbed current detector 23 is long, the input to the absorbed current detector 23 decreases for the aforementioned reason so that a desired absorbed current image corresponding to the micro pattern cannot be obtained. Moreover, also when the incident electron beam 2 scans at a high speed, for example, of about 1 sec/frame (1 frame=640×480 pixels), the absorbed current is provided as a high-frequency signal so that the signal-to-noise ratio decreases remarkably for the aforementioned reason to make observation difficult.

In the second embodiment, the absorbed current detectors 23 are mounted in the vacuum specimen chamber 26 and the signal wire length from each probe 19 to corresponding one of the absorbed current detectors 23 is shortened, for example, to several cm to thereby reduce capacitance of the wire to about several pF. Accordingly, an absorbed current signal with a high frequency of tens of kHz or higher is detected while the signal-to-noise ratio is maintained, so that an absorbed current image corresponding to the micro pattern can be observed. Moreover, also when the incident electron beam 2 scans at a high speed of about 1 sec/frame as described above, the absorbed current image can be obtained so that observation efficiency can be improved.

Figure 3:
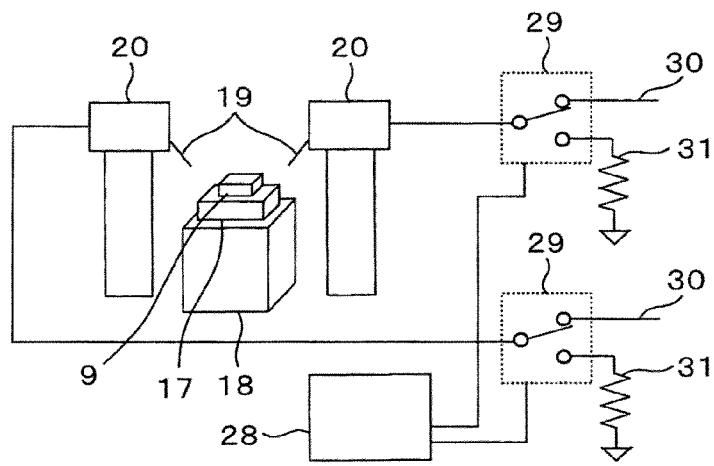
FIG. 3 is a diagram showing the configuration of a probe unit in a sample inspection device to which a third embodiment of the invention is applied.

FIG. 3 is a diagram showing the configuration of a probe portion in a sample inspection device to which a third embodiment of the invention is applied.

Portions in the third embodiment except FIG. 3 are the same as in the first or second embodiment. A probe unit in the third embodiment is characterized in that the probe unit has a function in which when the probes 19 are brought into contact with the sample 9, selectors 29 are operated by a selection controller 28 so that a signal path connected to each probe 19 is changed from a measurement-time signal path 30 to a slow leakage circuit 31. For example, each slow leakage circuit 31 is formed so that a resistance of from the order of kΩ to the order of hundreds of kΩ and an electrical earthing point of the device are connected to each other.

Because the probes 19 are irradiated with the incident electron beam 2 while the sample 9 is irradiated with the incident electron beam 2, there is a possibility that the probes 19 will be electrically charged. When the electrically charged probes 19 approach the sample 9, the probes 19 are electrically discharged. Because the diameter of each probe 19 is as small as the order of hundreds of nm, there is a possibility that the probe 19 will be damaged by the electric discharge. Moreover, in many cases, the sample 9 has a low tolerance to static electricity, so that there is a possibility that the sample 9 will be damaged by the electric discharge.

That is, when the electrically charged probes 19 approach the sample 9, there is a possibility that the probes 19 and the sample 9 will be damaged. The selectors 29 are formed so that the probes 19 are connected to the slow leakage circuits 31 unless the probes 19 are brought into contact with the sample 9. Moreover, the selectors 29 are formed so that the probes 19 are switched to the measurement-time signal paths 30 after the probes 19 are brought into contact with the sample 9. As a result, the probes 19 can be brought into contact with the sample 9 while the probes 19 are not electrically charged.

In the moment that each probe 19 comes into contact with the wiring pattern in the sample 9, electric charge stored in the sample 9 passes through the wiring pattern having conductivity in a concentrated manner and moves to the probe 19 side. When a partial disconnection as a target of analysis is contained in the wiring pattern but a large current flows in the wiring pattern by the aforementioned theory, there is a possibility that fusing or welding will occur in the partial disconnection to make it difficult to analyze an original defect. When the probes 19 are connected to the slow leakage circuits 31 unless the probes 19 are brought into contact with the sample 9, the amount of current flowing in the wiring pattern in the moment that the probes 19 come into contact with the wiring pattern in the sample 9 can be limited by the resistances in the slow leakage circuits 31. Accordingly, the partial disconnection can be prevented from being fused or welded.

By the aforementioned method, the risk of damaging the probes and the sample can be reduced even when the amount of current due to the incident electron beam is large.

Figure 4:
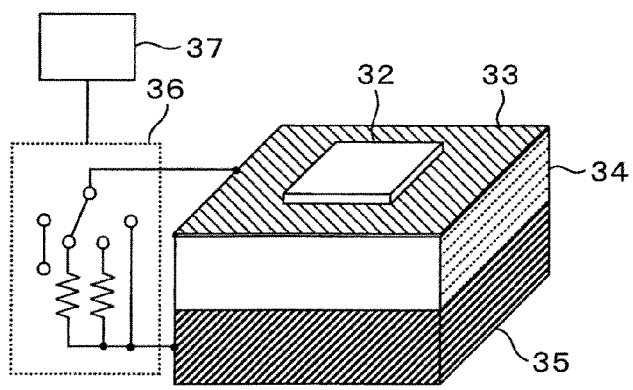
FIG. 4 is a diagram showing the configuration of a sample holder in a sample inspection device to which a fourth embodiment of the invention is applied.

FIG. 4 is a diagram showing the configuration of a sample holder in a sample inspection device to which a fourth embodiment of the invention is applied.

Portions in the fourth embodiment except FIG. 4 are the same as in any one of the first to third embodiments.

The sample holder in the fourth embodiment includes a metal thin plate 33 for placing a sample 32 thereon, an insulating layer 34 made of an insulating material, a foundation 35 made of a metal, a resistance selector 36, and a resistance selection controller 37.

The resistance selector 36 is connected to the metal thin plate 33 and the foundation 35 and has a function in which resistance between the metal thin plate 33 and the foundation 35 is selected from "short", "a range of from the order of $M\Omega$ to the order of $G\Omega$" and "open" in accordance with a control signal given from the resistance selection controller 37. The resistance may be variable resistance. The foundation 35 is connected to the earth potential of the device through the sample stage 18 in any one of FIGS. 1, 2 and 3.

For example, PEEK can be used as a material for forming the insulating layer 34. PEEK is a water-nonabsorbable insulator which is suitable as an insulator on which the sample is mounted.

In the sample inspection device using an electron beam, a sample table made of a metal is often used to avoid electrical charging of the sample and the sample table. However, when the wire in the sample comes into contact with the sample table on the assumption that the sample table has conductivity to the electrical earthing point of the device, an absorbed current on the wire flows toward the electrical earthing point so that the absorbed current cannot be detected.

In the sample holder in the fourth embodiment, even when the wire in the sample 32 comes into contact with the metal thin plate 33, the resistance selector 36 is operated to insert high resistance not lower than the resistance of the wire between the metal thin plate 33 and the electrical earthing point so that the amount of leakage of the absorbed current flowing in the wire to the earth potential can be reduced while electrical charging of the sample 32 is limited. The resistance may be provided as variable resistance corresponding to the resistance of the wire.

Moreover, when the probes are brought into contact with the sample 32, the metal thin plate 33 and the foundation 35 can be short-circuited by the resistance selector 36 to prevent electrical charging of the sample 32.

In this method, a current flows from the sample at the measurement time. As long as the current flowing from the sample due to the resistance is stationary to some degree, the current value can be treated as the background of the signal.

When a sample is mounted on the conventional sample table made of a metal, noise in the sample table has influence on the measurement. In the invention, however, measurement can be performed while this influence of noise is reduced.

Although the embodiment has been described in the case where the resistance selector 36 is brought into direct contact with the foundation 35 made of a metal, but is not limited thereto. For example, only an insulator may be disposed under the metal thin plate 33 so that one end of the resistance selector 36 is grounded through a resistance.

Figure 5:
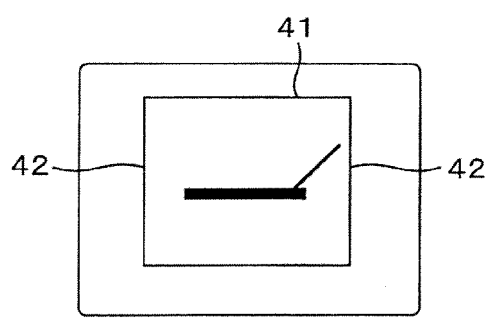
FIG. 5 shows a screen displayed on a monitor in a sample inspection device to which a fifth embodiment of the invention is applied.

FIG. 5 shows a screen displayed on a monitor in a sample inspection device to which a fifth embodiment of the invention is applied.

Portions in the fifth embodiment except FIG. 5 are the same as in any one of the first to fourth embodiments. On the monitor display screen in the fifth embodiment, a scanning point indicator 42 is displayed together with an absorbed current image 41. The scanning point indicator 42 indicates a point at which the incident electron beam is currently scanned in the absorbed current image 41. The scanning point indicator 42 moves down in the absorbed current image 41 or between opposite ends thereof as the scanning advances. For example, this function can be achieved by software which outputs a row number currently subjected to data updating in one frame of the absorbed current image from the video board 13 shown in FIGS. 1 and 2 so that the display point of the scanning point indicator 42 is updated in accordance with the row number.

When the incident electron beam scans another region on the sample than the wire with which the probes come into contact, the absorbed current image displayed on the monitor exhibits a uniform background color caused by background noise. For this reason, when scanning is performed at a low speed, for example, of about 40 sec/frame, it is difficult to specify the point of scanning in the background, so that there is a possibility that the operating person will miss the scanning point.

The view field of observation is changed successively for retrieving a defect in the sample. However, when the operating person misses the scanning point for the aforementioned reason during change in the view field of observation while the observation screen displayed on the monitor is kept as a screen of the absorbed current image in order to obtain reduction in damage of the sample caused by the incident electron beam irradiation and shortening of the retrieval time, retracing work for re-scanning occurs because it is impossible to determine whether scanning of the incident electron beam in the view field is completed or not.

By the scanning point indicating function in the fifth embodiment, the operating person can be prevented from missing the current scanning point of the incidental electron beam in retrieval of a defect in the sample based on observation of the absorbed current image, so that the working efficiency of the operating person can be improved.

REFERENCE SIGNS LIST 1 electron beam source
2 incident electron beam
3, 4 condenser lens
5 aperture
6 scanning deflector system
7 image shifting deflector system
8 objective lens
9, 32 sample
10 secondary electron
11 secondary electron detector
12 SEM controller
13 video board
14 memory
15 signal selection controller
16 monitor
17 sample holder
18 sample stage
19 probe
20 probe stage
21 wiring pattern
22 signal selector
23 absorbed current detector
24, 41 absorbed current image
25 semiconductor parameters analyzer
26 vacuum specimen chamber
27 metal casing
28 selection controller
29 selector
30 measurement-time signal path
31 slow leakage circuit
33 metal thin plate 34 insulating layer
35 foundation
36 resistance selector
37 resistance selection controller
42 scanning point indicator

The invention claimed is:

1. An inspection device comprising:
an electron beam source;
an objective lens which focuses an electron beam emitted from the electron beam source on a sample;
a sample stage on which the sample is placed, the sample stage including a conductive plate for placing the sample thereon, and a plate made of an insulating material;
a plurality of probes each disposed on a respective probe stage, the plurality of probes configured to come into contact with an upper surface the sample facing the electron beam source;
a switch which selects one from: a side for grounding the conductive plate, and a side for grounding the conductive plate through a resistance, wherein:
the switch is turned to the side for grounding the conductive plate through the resistance when a wire of the sample stage comes into contact with the conductive plate,
the probe stages are positioned at sides of the sample stage, and
the probe stages and sample stage are configured to move in directions of a plurality of axes.

2. An inspection device according to claim 1, wherein:
the resistance is higher than resistance of a wire contained in the sample.

3. An inspection device according to claim 1, wherein:
the resistance is a variable resistance.

4. An inspection device according to any one of claim 1, wherein:
the switch is turned to the side for grounding when the probe comes into contact with the sample.

5. An inspection device according to claim 4, wherein:
the switch is turned to the side for grounding when the probes are brought into contact with the sample.

6. An inspection device according to claim 2, wherein:
the resistance is a variable resistance.

7. An inspection device according to claim 2, wherein:
the switch is turned to the side for grounding when the probe comes into contact with the sample.

8. An inspection device according to claim 3, wherein:
the switch is turned to the side for grounding when the probe comes into contact with the sample.

9. An inspection device according to claim 6, wherein:
the switch is turned to the side for grounding when the probe comes into contact with the sample.

* * * * *